United States Patent
Yamada (10) Patent No.: US 11,031,365 B2
(45) Date of Patent: Jun. 8, 2021

(54) SEMICONDUCTOR DEVICE HAVING A SOLDER BLOCKING METAL LAYER

(71) Applicant: SUMITOMO ELECTRIC DEVICE INNOVATIONS, INC., Kanagawa (JP)

(72) Inventor: Fumio Yamada, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/450,644

(22) Filed: Jun. 24, 2019

(65) Prior Publication Data

US 2019/0393182 A1 Dec. 26, 2019

(30) Foreign Application Priority Data

Jun. 26, 2018 (JP) .............................. JP2018-121381

(51) Int. Cl.
*H01L 29/00* (2006.01)
*H01L 23/00* (2006.01)

(52) U.S. Cl.
CPC .............. *H01L 24/32* (2013.01); *H01L 24/08* (2013.01); *H01L 24/28* (2013.01); *H01L 2224/26* (2013.01); *H01L 2224/32059* (2013.01); *H01L 2924/014* (2013.01); *H01L 2924/01079* (2013.01); *H01L 2924/38* (2013.01)

(58) Field of Classification Search
CPC ......... H01L 24/32; H01L 24/08; H01L 24/26; H01L 2224/26
See application file for complete search history.

(56) References Cited

U.S. PATENT DOCUMENTS

| | | | | |
|---|---|---|---|---|
| 4,903,110 A * | 2/1990 | Aono | ..................... | H01G 4/008 361/313 |
| 5,729,561 A * | 3/1998 | Hironaka | ................. | H01L 24/32 372/36 |
| 5,812,570 A * | 9/1998 | Spaeth | ..................... | H01S 5/024 372/36 |
| 5,917,200 A * | 6/1999 | Kurata | .................... | H01L 24/81 257/744 |
| 6,858,871 B2 * | 2/2005 | Okada | ................... | H01L 31/167 257/782 |

(Continued)

FOREIGN PATENT DOCUMENTS

| | | |
|---|---|---|
| JP | 10-223808 | 8/1998 |
| JP | 2015-70052 | 4/2015 |

*Primary Examiner* — Ida M Soward
(74) *Attorney, Agent, or Firm* — Smith, Gambrell & Russell, LLP.

(57) ABSTRACT

A semiconductor device including a mounting substrate, a semiconductor chip, a rear-surface metal layer, an AuSn solder layer, and a solder blocking metal layer, is disclosed. The semiconductor chip is mounted on the mounting substrate, and includes front and rear surfaces, and a heat generating element. The rear-surface metal layer includes gold (Au). The AuSn solder layer is located between the mounting substrate and the rear surface to fix the semiconductor chip to the mounting substrate. The solder blocking metal layer is located between the rear surface and the mounting substrate, and in a non-heating region excluding a heating region in which the heat generating element is formed. The solder blocking metal layer includes at least one of NiCr, Ni and Ti and extends to an edge of the semiconductor chip. A void is provided between the solder blocking metal layer and the AuSn solder layer.

11 Claims, 5 Drawing Sheets

(56) References Cited

U.S. PATENT DOCUMENTS

| | | | | |
|---|---|---|---|---|
| 7,009,299 B2* | 3/2006 | Angst | B23K 1/0016 | 257/772 |
| 7,126,165 B2* | 10/2006 | Kwak | H01S 5/02272 | 257/99 |
| 7,196,356 B2* | 3/2007 | Ishii | B23K 1/0016 | 257/81 |
| 7,247,514 B2* | 7/2007 | Yamane | H01S 5/02272 | 438/106 |
| 7,348,212 B2* | 3/2008 | Schiaffino | H01L 33/0095 | 257/E21.499 |
| 7,443,901 B2* | 10/2008 | Inoue | H01S 5/04254 | 372/87 |
| 7,476,977 B2* | 1/2009 | Fujinaga | B23K 1/0016 | 257/779 |
| 7,606,275 B2* | 10/2009 | Kunimasa | H01L 24/32 | 372/34 |
| 7,626,275 B2* | 12/2009 | Ito | H01L 23/49513 | 257/779 |
| 7,642,121 B2* | 1/2010 | Slater, Jr. | H01L 33/40 | 438/85 |
| 8,404,359 B2* | 3/2013 | Oshika | H01L 24/29 | 428/672 |
| 8,472,208 B2* | 6/2013 | Oshika | H01L 21/4864 | 361/772 |
| 9,035,407 B2* | 5/2015 | Hamada | H01L 24/32 | 257/432 |
| 9,450,380 B2* | 9/2016 | Yamamoto | H01S 5/0224 | |
| 9,822,284 B2* | 11/2017 | Usugi | B32B 3/085 | |
| 10,396,008 B2* | 8/2019 | Takahagi | H01L 23/49524 | |
| 10,493,567 B2* | 12/2019 | Sakai | H01L 24/26 | |
| 2007/0201122 A1* | 8/2007 | Dozeman | B60R 1/088 | 359/265 |
| 2015/0140806 A1* | 5/2015 | Radulescu | H01L 21/32139 | 438/627 |

* cited by examiner

SEMICONDUCTOR DEVICE HAVING A SOLDER BLOCKING METAL LAYER

CROSS REFERENCE TO RELATED APPLICATIONS

The present application is based upon and claims the benefit of the priority from Japanese patent application No. 2018-121381, filed on Jun. 26, 2018, which is hereby incorporated by reference in its entirety.

TECHNICAL FIELD

The present disclosure relates to a semiconductor device and a method of manufacturing a semiconductor device.

BACKGROUND

In general, a monolithic microwave integrated circuit (MMIC) mounted in a face-up manner is fixed to a package with silver (Ag) paste or gold-tin (AuSn) solder. When using the AuSn solder, the AuSn solder interposed between a semiconductor chip and the package is melted, and gold (Au) formed on a rear surface of the semiconductor chip and Au formed on a front surface of the package are fixed. The AuSn solder has poor thermal conductivity, and thus it is preferable that the AuSn solder is thin. In addition, when air bubbles (voids) enter the inside of the AuSn solder, thermal resistance from the semiconductor chip to the package significantly increases. Thus, the AuSn solder is formed in a small thickness by scrubbing the semiconductor chip, and mounting is performed in such a manner that air bubbles do not enter the AuSn solder, in mounting using the AuSn solder.

It is, however, difficult to completely remove air bubbles due to a variation in manufacturing, even though performing scrubbing. When air bubbles exist below a portion of a field effect transistor (FET) formed in a semiconductor chip, temperature rise due to heat generation of the FET becomes larger than assumption, and an operational lifespan of a device may deteriorate.

JP2015-070052A discloses a method of removing air bubbles in molten solder by using a pressure-reduced furnace when mounting the semiconductor chip to prevent an adverse effect due to air bubbles. JP-H10-223808A discloses a method in which a groove is formed at a site that does not overlap an active region of the FET on the rear surface of the semiconductor chip, and air bubbles inside AuSn solder are trapped in the groove through scrubbing during die bonding.

SUMMARY

The present disclosure provides a semiconductor device. The semiconductor device comprises a mounting substrate, a semiconductor chip, a rear-surface metal layer, an AuSn solder layer, and a solder blocking metal layer. The semiconductor chip is mounted on the mounting substrate. The semiconductor chip includes a rear surface facing the mounting substrate, a front surface opposite to the rear surface, and at least one heat generating element formed on the front surface. The rear-surface metal layer is formed on the rear surface of the semiconductor chip. The rear-surface metal layer includes gold (Au). The AuSn solder layer is located between the mounting substrate and the rear surface of the semiconductor chip to fix the semiconductor chip to the mounting substrate through the rear-surface metal layer. The solder blocking metal layer is located between the rear surface of the semiconductor chip and the mounting substrate, and in a non-heating region excluding a heating region in which the heat generating element is formed. The solder blocking metal layer includes at least one of nickel-chrome (NiCr), nickel (Ni) and titanium (Ti) and extends to a first edge of the semiconductor chip. A void is provided between the solder blocking metal layer and the AuSn solder layer.

The present disclosure provides a method of manufacturing a semiconductor device. The method comprises: forming a seed metal layer on a rear surface of a semiconductor chip, the semiconductor chip comprising a first region that includes a semiconductor heat generating element and a second region that does not include the semiconductor heat generating element; forming a rear-surface metal layer including gold (Au) on the seed metal layer; forming a solder blocking metal layer including at least one of nickel-chrome (NiCr), nickel (Ni) and titanium (Ti) on the rear-surface metal layer to extend to an edge of the semiconductor chip within the second region; and scrubbing the semiconductor chip on the mounting substrate with contacting the rear-surface metal layer with the AuSn solder layer.

The present disclosure further provides another method of manufacturing a semiconductor device. The method comprises: forming a solder blocking metal layer including at least one of nickel-chrome (NiCr), nickel (Ni) and titanium (Ti) on a rear surface of a semiconductor chip, the semiconductor chip comprising a first region that includes a semiconductor heat generating element and a second region that does not include the semiconductor heat generating element; forming a rear-surface metal layer including gold (Au) on the solder blocking metal layer; exposing the solder blocking metal layer from the rear-surface metal layer in a region ranging to an edge of the semiconductor chip within the second region; and scrubbing the semiconductor chip on the mounting substrate with contacting the rear-surface metal layer with the AuSn solder layer.

BRIEF DESCRIPTION OF THE DRAWINGS

The foregoing and other purposes, aspects and advantages will be better understood from the following detailed description of embodiments of the disclosure with reference to the drawings, in which.

DETAILED DESCRIPTION

Problem to be Solved by the Present Disclosure

The method disclosed in JP2015-070052A requires an evacuation device to remove air bubbles through a vacuum process. The method disclosed in JP-H10-223808A may not be able to trap air bubbles if the AuSn solder enters the groove during scrubbing Effect of the Present Disclosure According to the present disclosure, it is possible to reduce occurrence of air bubbles inside solder on a rear surface of a region of a heat generating element formed in a semiconductor chip.

Description of Embodiments of the Present Disclosure

Embodiments of the present disclosure will be described. A semiconductor device according to one embodiment of the disclosure comprises a mounting substrate, a semiconductor chip, a rear-surface metal layer, an AuSn solder layer, and a solder blocking metal layer. The semiconductor chip is mounted on the mounting substrate. The semiconductor chip includes a rear surface facing the mounting substrate, a front surface opposite to the rear surface, and at least one heat generating element formed on the front surface. The rear-surface metal layer is formed on the rear surface of the semiconductor chip. The rear-surface metal layer includes gold (Au). The AuSn solder layer is located between the mounting substrate and the rear surface of the semiconductor chip to fix the semiconductor chip to the mounting substrate through the rear-surface metal layer. The solder blocking metal layer is located between the rear surface of the semiconductor chip and the mounting substrate, and in a non-heating region excluding a heating region in which the heat generating element is formed. The solder blocking metal layer includes at least one of nickel-chrome (NiCr), nickel (Ni) and titanium (Ti) and extends to a first edge of the semiconductor chip. A void is provided between the solder blocking metal layer and the AuSn solder layer.

According to this embodiment, voids occurred in the AuSn solder layer can be collected to the periphery of the solder blocking metal layer with poor wettability with the AuSn solder, and the voids can be discharged to the outside. Thus, it is possible to reduce occurrence of air bubbles occurred in the AuSn solder layer on the rear surface of a region of the heat generating element formed in the semiconductor chip. Therefore, this embodiment can efficiently dissipate heat transferred from the semiconductor chip.

As one embodiment, the solder blocking metal layer may be formed on the rear-surface metal layer and between the mounting substrate and the rear-surface metal layer. According to this embodiment, the solder blocking metal layer is formed on a rear-surface electrode layer in a protruding shape, and thus it is possible to enhance collection efficiency of air bubbles occurred in the solder.

As one embodiment, the rear-surface metal layer may be formed on a seed metal layer formed on the rear surface of the semiconductor chip. According to this embodiment, the rear-surface metal layer can be formed through selective electrolytic plating, and it is easy to adjust the thickness of a rear-surface electrode. In this embodiment, the seed metal layer may be formed as the solder blocking metal layer, the seed metal layer may include at least one of nickel-chrome (NiCr), nickel (Ni) and titanium (Ti) and the solder blocking metal layer may be exposed at a portion in which the rear-surface metal layer is removed. According to this configuration, the seed metal layer can be used as the solder blocking metal layer, and thus it is possible to reduce a total number of metal layers formed on the rear surface of the semiconductor chip.

As one embodiment, the solder blocking metal layer may linearly extend from a second edge, opposite to the first edge, of the semiconductor chip to the first edge. According to this embodiment, it is easy to discharge air bubbles collected at the periphery of the solder blocking metal layer to the outside of the semiconductor chip.

As one embodiment, the mounting substrate may be a bottom material of a package accommodating the semiconductor chip. According to this embodiment, when mounting the semiconductor chip on the bottom material of the package, heat transferred from semiconductor chip can be efficiently dissipated through the bottom material of the package.

A method of manufacturing a semiconductor device according to one embodiment of the disclosure comprises: forming a seed metal layer on a rear surface of a semiconductor chip, the semiconductor chip comprising a first region that includes a semiconductor heat generating element and a second region that does not include the semiconductor heat generating element; forming a rear-surface metal layer including gold (Au) on the seed metal layer; forming a solder blocking metal layer including at least one of nickel-chrome (NiCr), nickel (Ni) and titanium (Ti) on the rear-surface metal layer to extend to an edge of the semiconductor chip within the second region; and scrubbing the semiconductor chip on the mounting substrate with contacting the rear-surface metal layer with the AuSn solder layer.

According to this embodiment, voids occurred in the AuSn solder layer can be collected to the periphery of the solder blocking metal layer with poor wettability with the AuSn solder, and the voids can be discharged to the outside. Thus, it is possible to reduce occurrence of air bubbles occurred in the solder on the rear surface of a region of the heat generating element formed in the semiconductor chip. Therefore, this embodiment can efficiently dissipate heat transferred from the semiconductor chip. In addition, the solder blocking metal layer is formed on a rear-surface electrode layer in a protruding shape, and thus it is possible to enhance collection efficiency of air bubbles occurred in the solder.

A method of manufacturing a semiconductor device according to another embodiment of the disclosure comprises: forming a solder blocking metal layer including at least one of nickel-chrome (NiCr), nickel (Ni) and titanium (Ti) on a rear surface of a semiconductor chip, the semiconductor chip comprising a first region that includes a semiconductor heat generating element and a second region that does not include the semiconductor heat generating element; forming a rear-surface metal layer including gold (Au) on the solder blocking metal layer; exposing the solder blocking metal layer from the rear-surface metal layer in a region ranging to an edge of the semiconductor chip within the second region; and scrubbing the semiconductor chip on the mounting substrate with contacting the rear-surface metal layer with the AuSn solder layer.

According to this embodiment, voids occurred in the AuSn solder layer can be collected to the periphery of the solder blocking metal layer with poor wettability with the AuSn solder, and the voids can be discharged to the outside. Thus, it is possible to reduce occurrence of air bubbles occurred in the solder on the rear surface of a region of the heat generating element formed in the semiconductor chip. Therefore, this embodiment can efficiently dissipate heat transferred from the semiconductor chip.

Details of the Embodiments of the Present Disclosure

Hereinafter, embodiments of a semiconductor device and a method of manufacturing a semiconductor device of the disclosure will be described with reference to the accompanying drawings. In the following description, a configuration to which the same reference numeral is given is regarded as the same configuration even in the other drawings, and description thereof may be omitted. Note that, the invention is not limited to the embodiments, and includes all modifications in a range of configurations described in the appended claims, and in an equivalent range thereof. In addition, the invention includes a combination of arbitrary embodiments as long as a combination is possible with respect to a plurality of embodiments.

First Embodiment

Figure 1A:
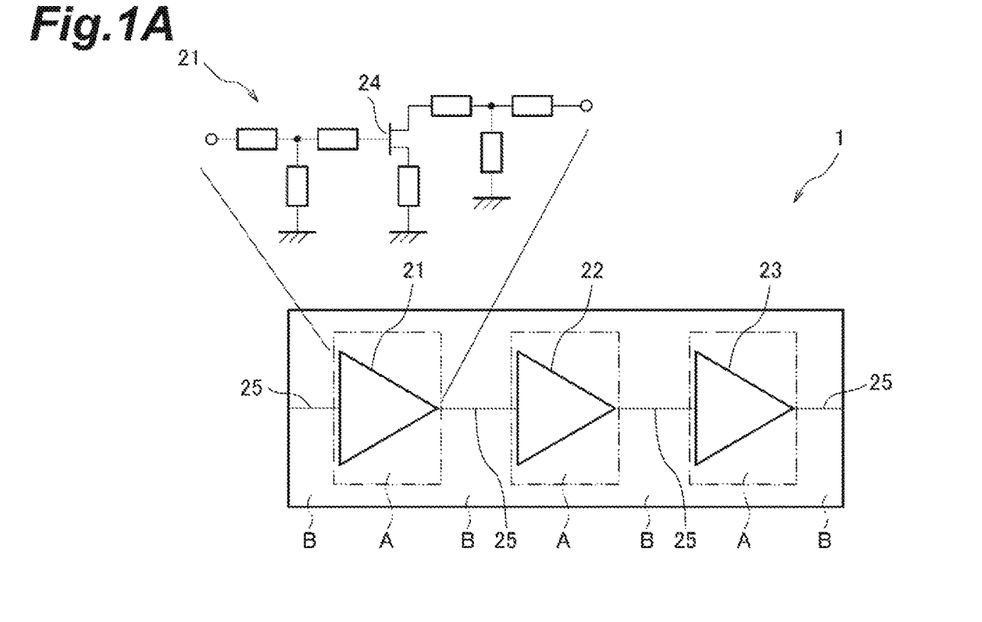
FIG. 1A is a view schematically illustrating a front surface of a semiconductor chip of a semiconductor device according to a first embodiment.
Figure 1B:
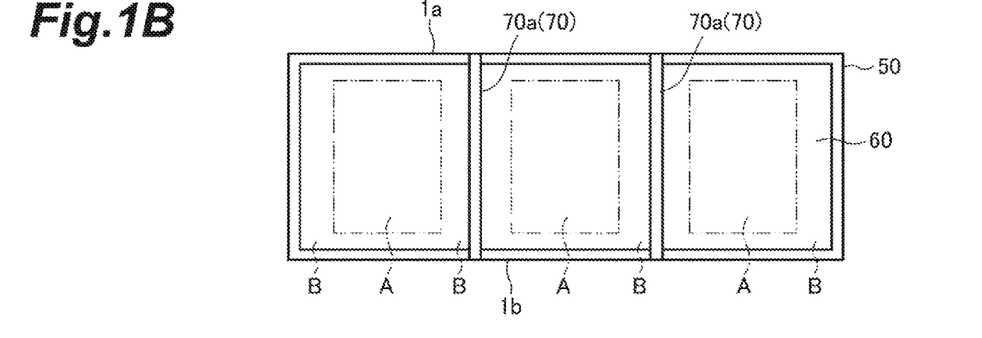
FIG. 1B is a view illustrating a rear surface of the semiconductor chip illustrated in FIG. 1A.
Figure 1C:
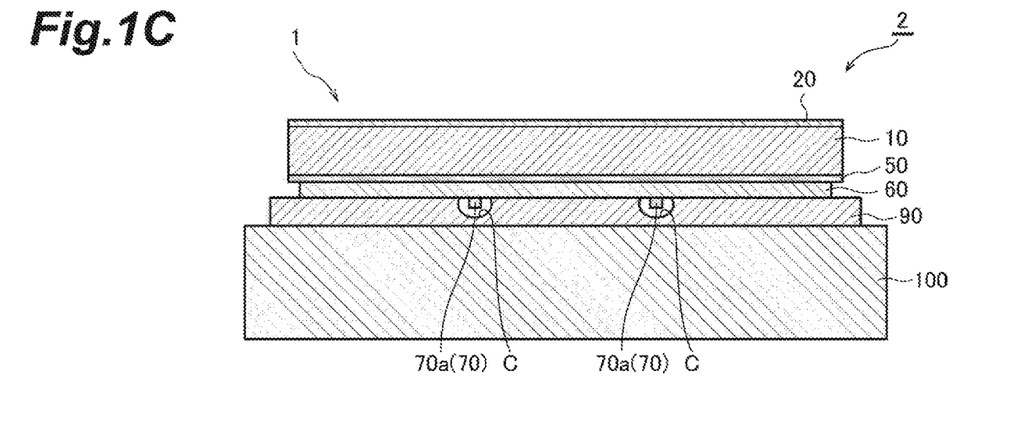
FIG. 1C is a view illustrating a cross-section of the semiconductor device according to the first embodiment.

FIG. 1A is a view schematically illustrating a front surface of a semiconductor chip 1 of a semiconductor device 2 according to a first embodiment, and FIG. 1B is a view illustrating a rear surface of the semiconductor chip 1 illustrated in FIG. 1A. FIG. 1C is a view illustrating a cross-section of the semiconductor device 2 according to the first embodiment, and illustrates a cross-section when mounting the semiconductor chip 1 illustrated in FIG. 1A and FIG. 1B on a mounting substrate 100. As shown in FIG. 1A to FIG. 1C, the semiconductor device 2 includes the semiconductor chip 1, a seed metal layer 50, a rear-surface metal layer 60, a metal layer 70, an AuSn solder layer 90, and the mounting substrate 100. The semiconductor chip 1 has a silicon carbide (SiC) substrate 10 and a gallium arsenide epitaxial layer 20. In the following description, as the semiconductor chip 1, an MIMIC is exemplified, but the semiconductor chip 1 is not limited thereto.

The MMIC is an integrated circuit in which one or more radio frequency circuit blocks are provided on a semiconductor substrate and an active element and a passive element are integrally formed by a semiconductor manufacturing process. In an example of a semiconductor chip 1 illustrated in FIG. 1A, there is illustrated an example in which a multi-stage amplifier including an initial stage amplifier 21, an intermediate stage amplifier 22, and a distal stage amplifier 23 is formed in a gallium arsenide epitaxial layer 20 formed on a silicon carbide (SiC) substrate 10 of approximately 1 mm×approximately 3 mm Each of the amplifiers 21 to 23 is constructed by an FET 24 that is an active element, and a passive element, and are connected by a transmission line 25.

In the semiconductor chip 1, the FET 24 becomes a heat generating element during operation, and thus the amount of heat generation is greatest in sites of the amplifiers 21 to 23 provided with the FETs 24, and the amount of heat generation is small at a location in which only the transmission line 25 is provided. In FIG. 1A, a region A that includes the heat generating element is illustrated, and a region B that does not include the heat generating element is illustrated. The region B that does not include the heat generating element includes a peripheral portion of the semiconductor chip, and a region between the stages of the amplifiers 21 to 23. If air bubbles occur in the region A when a rear surface of the semiconductor chip 1 is mounted on a mounting substrate 100 by using AuSn solder layer 90, heat transferred from the FET 24 that is the heat generating element is not efficiently dissipated, and thus a temperature of the region A becomes higher, circuit characteristics deteriorate, and an operational lifespan of the semiconductor device may be shortened.

However, in this embodiment, the rear surface of the semiconductor chip 1 is plated with the seed metal layer 50 and the rear-surface metal layer 60 that is formed on the seed metal layer 50 and is formed form Gold (Au). In addition, in this embodiment, a metal layer 70 formed from any one among nickel-chrome (NiCr), nickel (Ni), and titanium (Ti) of which wettability with the AuSn solder layer 90 is poor is provided on the rear-surface metal layer 60. As illustrated in FIG. 1B, a pair of bar portions 70a of the metal layer 70 extends from one edge 1a of the semiconductor chip 1 to another edge 1b opposite to the one edge 1a through inter-stage regions (the regions B) on the rear surface of the semiconductor chip 1. As described above, the metal layer 70 is exposed on the rear-surface metal layer 60 when viewed from the rear surface of the semiconductor chip 1.

The semiconductor chip 1 is mounted on the mounting substrate 100 by using the AuSn solder layer 90. The mounting substrate 100 is a bottom material of a package that accommodates the semiconductor chip 1, and is formed from, for example, copper (Cu), but may be formed form other materials. Since NiCr, Ni, and Ti have poor wettability with the AuSn solder layer 90, and thus AuSn solder of the AuSn solder layer 90 is flipped when mounting the semiconductor chip 1 on the mounting substrate 100. Thus, voids C occur at the periphery of the bar portions 70a of the metal layer 70 as illustrated in FIG. 1C. In addition, scrubbing is performed on the mounting substrate 100 when mounting the semiconductor chip 1, and thus air bubbles which occur in the AuSn solder layer 90 are collected to the voids C, and are discharged to the outside along the voids C formed toward edges 1a, 1b of the semiconductor chip 1.

According to the above configuration, it is possible to reduce air bubbles which occur on the rear-surface metal layer 60 corresponding to the region A. In addition, the voids C occur in the region B, and thus heat transfer from the rear-surface metal layer 60 to the mounting substrate 100 deteriorates, and a temperature of the region B rises. However, the heating element such as the FET is not provided in the region B, and thus the operational lifespan of the semiconductor chip 1 is not shortened.

[Semiconductor Chip Mounting Method]

Figure 2A:
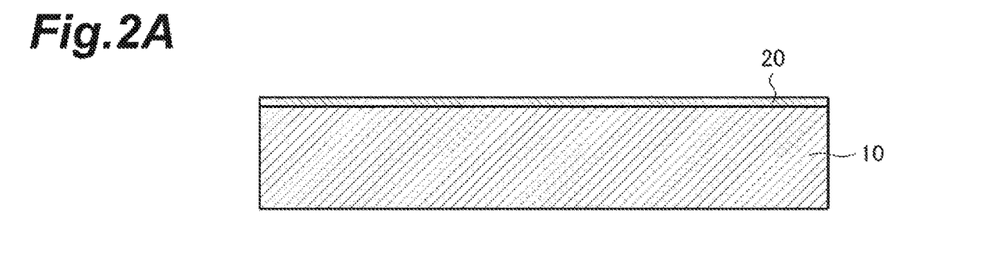
FIGS. 2A to 2J are views for describing respective processes in a semiconductor chip mounting method according to the first embodiment.
Figure 2B:
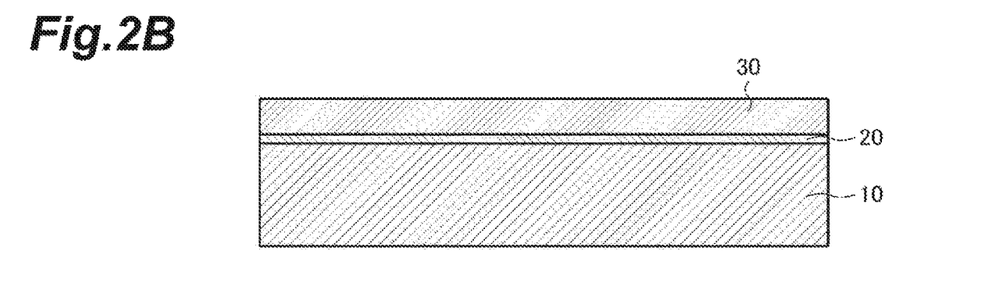
Figure 2C:
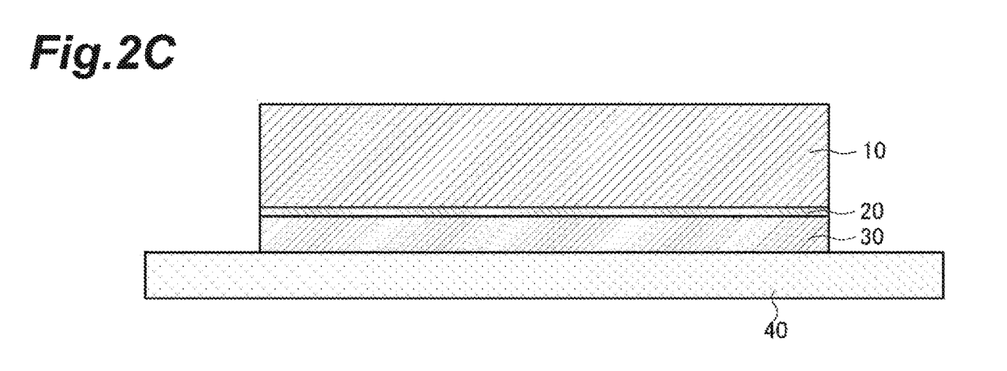
Figure 2D:
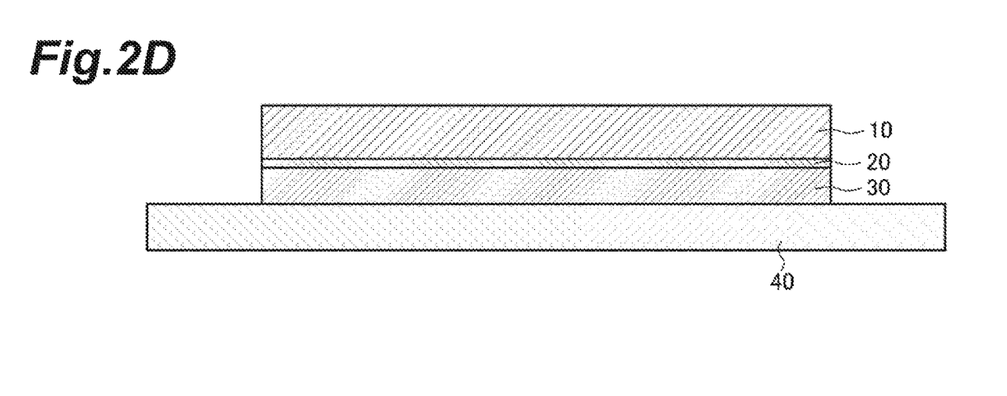
Figure 2E:
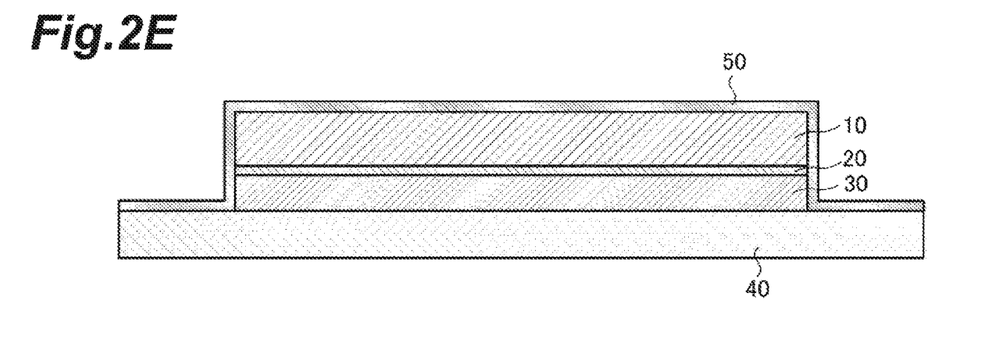
Figure 2F:
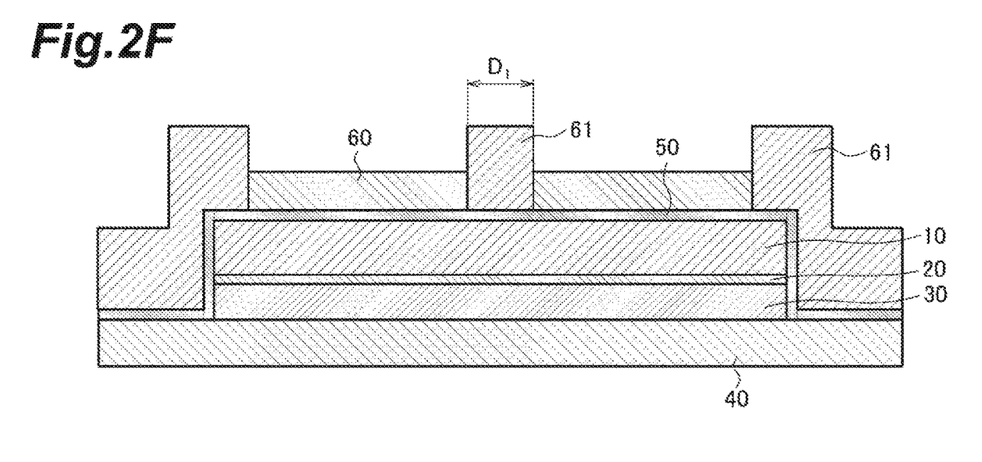
Figure 2G:
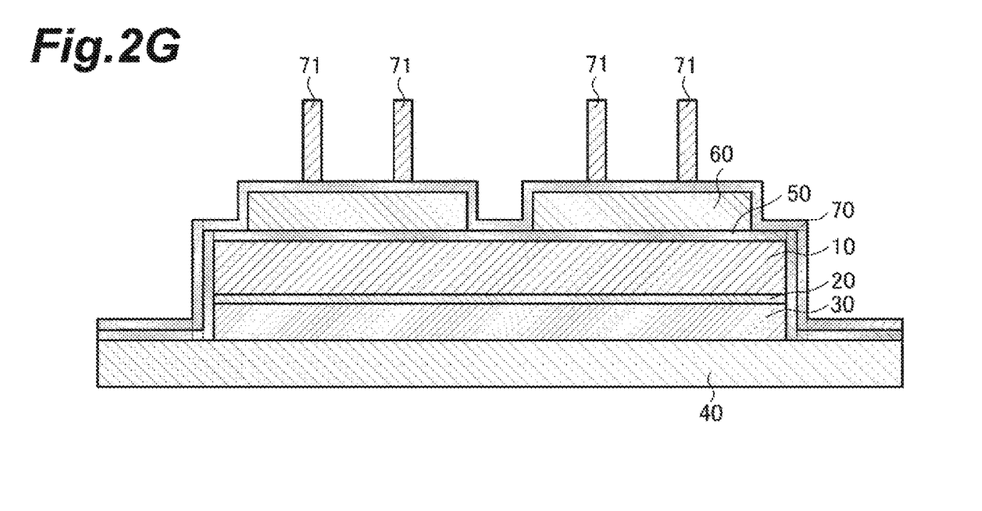
Figure 2H:
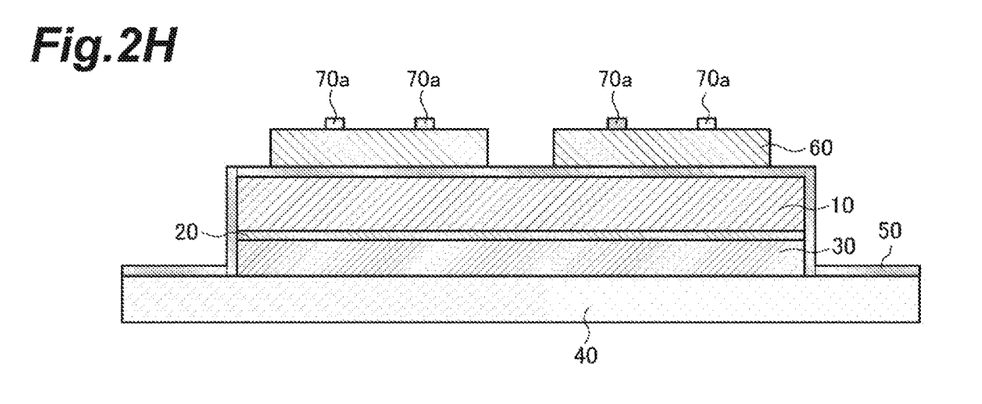
Figure 2I:
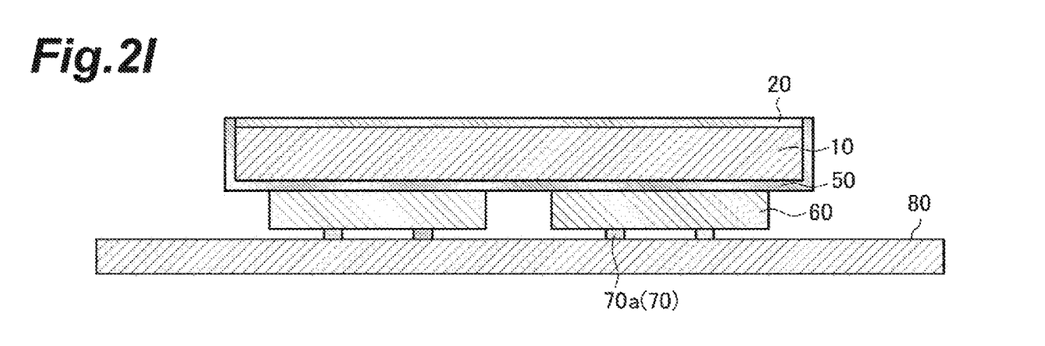
Figure 2J:
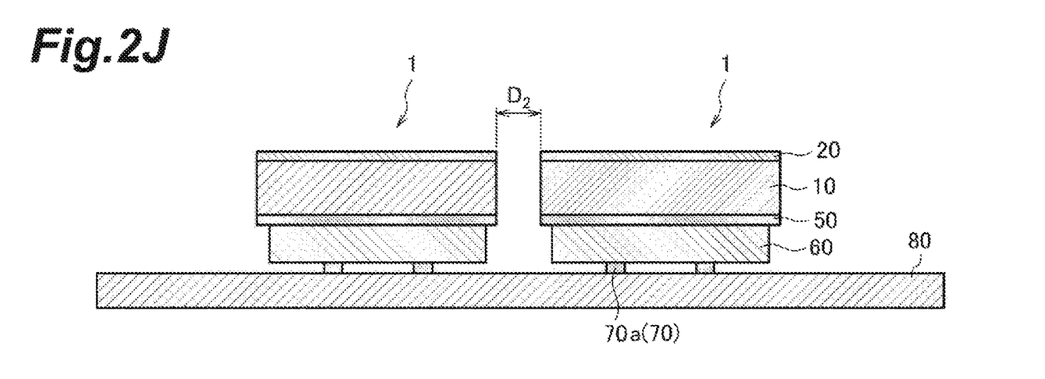

Next, a semiconductor chip mounting method, which is a method of manufacturing the semiconductor device 2, will be described. FIG. 2A to FIG. 2J are views describing respective processes in the semiconductor chip mounting method according to the first embodiment. FIG. 2A illustrates a front surface processing process, FIG. 2B illustrates a photoresist application process, FIG. 2C illustrates a support substrate attaching process, FIG. 2D illustrates a rear surface polishing process, FIG. 2E illustrates a seed metal layer forming process, FIG. 2F illustrates a rear surface metal layer plating process, FIG. 2G illustrates a solder blocking metal layer forming process, FIG. 2H illustrates a solder blocking metal layer patterning process, FIG. 2I illustrates an expanding tape attaching process, and FIG. 2J illustrates a dicing process, and the respective processes are sequentially performed. Note that, in FIG. 2A to FIG. 2J, a thickness relationship of respective constituent members is set to be different from an actual thickness relationship for easiness of viewing. In addition, FIG. 1C is used to describe a die bonding process.

(Front Surface Processing Process)

In the front surface processing process, as illustrated in FIG. 2A, the epitaxial layer 20 such as GaAs is formed on a front surface of the semiconductor substrate 10 having a thickness of approximately 500 µm, an active element is formed in the epitaxial layer 20, and a passive element, a transmission line, and the like are formed on the epitaxial layer 20 through an insulating layer, thereby forming a plurality of the semiconductor chips 1 which constitute the MMIC. The elements are prepared by using an existing semiconductor manufacturing technology. For example, as illustrated in FIG. 1A, the multi-stage amplifiers 21 to 23, and the transmission line 25 that connects the amplifiers 21 to 23 are formed.

(Photoresist Application Process)

Next, as illustrated in FIG. 2B, to protect the respective elements formed on the front surface of the substrate 10, a photoresist 30 is applied to the front surface (on the epitaxial layer 20) of the substrate, and wax (not illustrated) is applied onto the photoresist 30.

(Support Substrate Attaching Process)

Next, as illustrated in FIG. 2C, for processing of the rear surface (opposite to the epitaxial layer 20) of the substrate 10, the front surface (the epitaxial layer 20) is made to face a support substrate 40 formed from glass and is attached thereto.

(Rear Surface Polishing Process)

Next, as illustrated in FIG. 2D, the rear surface of the substrate 10 is polished with a grinder so that the substrate 10 has a predetermined thickness. The thickness of the substrate 10 is adjusted to set characteristic impedance of a line to a desired value when a metal pattern for a signal line formed on the front surface and the rear-surface metal layer 60 form a microstrip line through the substrate 10. Note that, a metal pattern of a ground potential on the front surface and the rear-surface metal layer 60 are electrically connected to each other through a via hole (not illustrated). In this process, for example, the substrate 10 is polished to a thickness of approximately 100 µm.

(Seed Metal Layer Forming Process)

Next, as illustrated in FIG. 2E, as the seed metal layer 50, a seed metal layer 50 constituted by two layers of NiCr and Au is formed on the rear surface of the SiC substrate 10 through entire-surface sputtering. The seed metal layer 50 is used to form the rear-surface metal layer 60 through selective electrolytic plating in a subsequent process. For example, NiCr and Au of the seed metal layer 50 are formed in a thickness of 200 nm and in a thickness of 2000 nm, respectively.

(Rear-Surface Metal Layer Plating Process)

As illustrated in FIG. 2F, in the substrate 10, a plurality of semiconductor chips are formed in a state of being partitioned by scribe line each having a predetermined width $D_1$. After forming the seed metal layer 50, a photoresist is provided on the entire surface of the seed metal layer 50, and the photoresist is patterned in accordance with a photoresist 61 that covers a width $D_1$ between scribe lines while leaving a semiconductor chip region. The rear-surface metal layer 60 formed from Au is formed on the seed metal layer 50 exposed to the rear surface of the semiconductor chip, for example, in a thickness of 10 µm through selective electrolytic plating. The photoresist 61 is removed after forming the rear-surface metal layer 60.

(Solder Blocking Metal Layer Forming Process)

Next, as illustrated in FIG. 2G, after removing the photoresist 61, for example, NiCr having poor wettability with the AuSn solder is formed on the entire surface of the rear-surface metal layer 60 through sputtering to provide a metal layer 70 having a thickness of approximately 50 nm. Then, photoresists 71 are patterned on the metal layer 70.

(Solder Blocking Metal Layer Patterning Process)

Next, the metal layer 70 is etched by using the photoresists 71 as a mask, and as illustrated in FIG. 2H, the line-shaped bar portions 70a of the metal layer 70 each having a width of approximately 100 µm are left on the rear-surface metal layer 60. As illustrated in FIG. 1B, the bar portions 70a of the metal layer 70 extends from one edge 1a to the other edge 1b of the semiconductor chip 1 in the region B of the semiconductor chip 1. This process is performed as follows. That is, a region in which the metal layer 70 formed from NiCr is to be left is masked with the photoresist 71 as illustrated in FIG. 2G, the metal layer 70 is wet-etched, and then the photoresists 71 are removed.

(Expanding Tape Joining Process)

Next, as illustrated in FIG. 2I, the rear surface of the substrate 10 is attached to an expanding tape 80, the wax (not illustrated) and the photoresist 30 on the front surface are removed, and the substrate is peeled off from the support substrate 40. Note that, after removing the wax (not illustrated) and the photoresist 30 on the front surface and peeling off the substrate 10 from the support substrate 40, the rear surface of the substrate 10 may be attached to the expanding tape 80. In this process, the substrate 10 is not diced, and thus the respective semiconductor chips 1 are not separated.

(Dicing Process)

Next, as illustrated in FIG. 2J, the semiconductor chips 1 are separated through dicing on the front surface of the substrate 10. Dicing is formed along the scribe lines, for example, within a scribe line width $D_1$ by using a dicing blade having a width $D_2$ narrower than the scribe line width $D_1$. In addition, the semiconductor chips 1 are peeled off from the expanding tape 80, thereby obtaining individual semiconductor chips 1.

(Die Bonding Process)

Next, as illustrated in FIG. 1C, each of the semiconductor chips 1 is die-bonded onto, for example, a wiring substrate or the mounting substrate 100 formed from a bottom material (metal material) of the package. The die bonding is performed as follows. That is, the AuSn solder layer 90 is provided on the mounting substrate 100 in advance in a ball shape or a sheet shape (thin film shape), the AuSn solder layer 90 is melted on the mounting substrate 100, for example, in a nitrogen gas ($N_2$) atmosphere set to 320° C., and the semiconductor chip 1 is scrubbed (rubbed) on the mounting substrate 100 (rubbed on each other).

At this time, as described above, the metal layer 70 formed from NiCr has poor wettability with the AuSn solder layer 90, and the voids C may be formed in a portion of the metal layer 70 during mounting. When air bubbles which occur in the AuSn solder reach the metal layer 70 due to the scrubbing, the air bubbles are discharged to the outside of the chip along the line-shaped metal layer 70. In addition, the melted AuSn solder layer 90 has good wettability with Au, and spreads in an even thickness between Au of the rear-surface metal layer 60 of the semiconductor chip 1 and Au on the mounting substrate 100. At this time, the thickness of the AuSn solder becomes approximately 10 µm. According to this, since air bubbles disappear on the rear surface of the region A of the semiconductor chip 1, heat dissipation efficiency is enhanced, deterioration of circuit characteristics is suppressed, and long operational lifespan of the semiconductor device can be realized.

Second Embodiment

In the present disclosure, when fixing the rear-surface metal layer 60 to the mounting substrate 100 by using the AuSn solder layer 90, air bubbles which occur in the AuSn solder layer 90 are collected by a pattern of the metal layer 70 having poor wettability with the AuSn solder layer 90, and are discharged to the outside of the semiconductor chip 1. According to this, the pattern of the metal layer 70 may be exposed from the rear-surface metal layer 60 when viewed from the rear surface of the semiconductor chip 1. In the first embodiment, the seed metal layer 50 and the rear-surface metal layer 60 are sequentially formed on the rear surface of the substrate 10, and the metal layer 70 is patterned on the rear-surface metal layer 60, thereby exposing the metal layer 70.

Figure 3A:
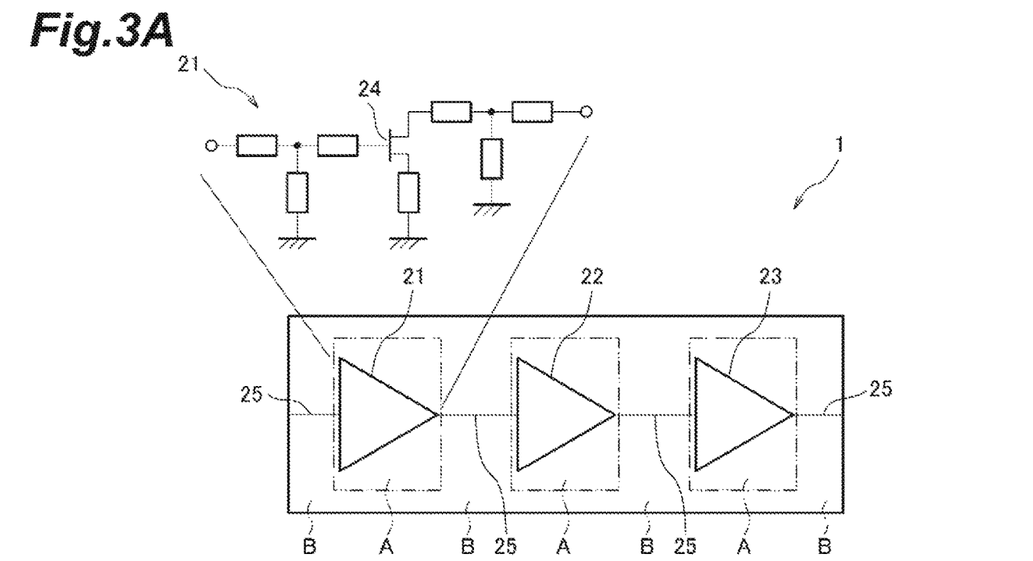
FIG. 3A is a view schematically illustrating a front surface of a semiconductor chip of a semiconductor device according to a second embodiment.
Figure 3B:
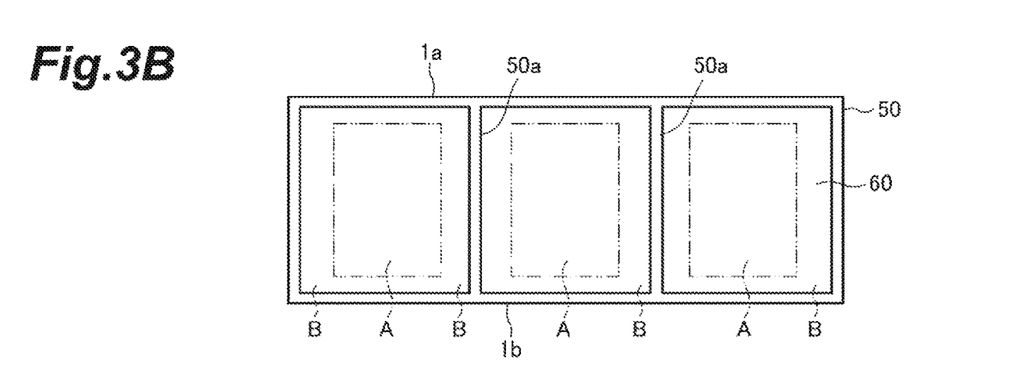
FIG. 3B is a view illustrating a rear surface of the semiconductor chip illustrated in FIG. 3A.
Figure 3C:
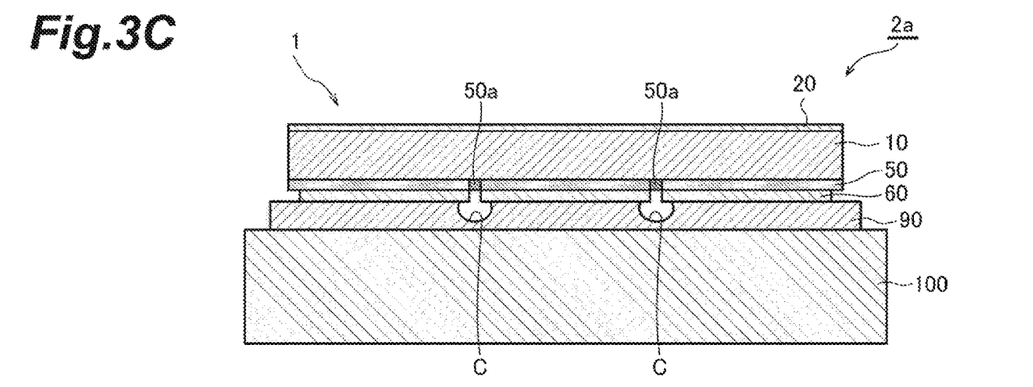
FIG. 3C is a view illustrating a cross-section of the semiconductor device according to the second embodiment.

In a second embodiment, a material of the seed metal layer 50 of the semiconductor device 2a is set to a material composed of any one among NiCr, Ni, and Ti which have poor wettability with the AuSn solder layer 90, and the seed metal layer 50 is provided with a function of the solder blocking metal layer, as shown in FIG. 3A to FIG. 3C. According to this, in the second embodiment, the seed metal layer 50 serves as the metal layer 70 of the first embodiment and the semiconductor device 2a does not include the metal layer 70. In addition, the rear-surface metal layer 60 formed on the seed metal layer 50 is partially removed to expose a pair of bar portion 50a of the seed metal layer 50. The bar portions 50a, regions in which the seed metal layer 50 is exposed, extend within the region B of the semiconductor chip 1 between edges 1a, 1b of the semiconductor chip 1. A function of the bar portions 50a of the seed metal layer 50 exposed from the rear-surface metal layer 60, which corresponds to the function of the metal layer 70, is the same as in the first embodiment, and thus description thereof will be omitted.

Hereinbefore, description has been given of the semiconductor device and the semiconductor chip mounting method according to the embodiments of the disclosure, but the patterns of the bar portions 70a of the metal layer 70 and of the bar portions 50a of the seed metal layer 50 each having poor wettability with the AuSn solder layer 90 are not limited to the line shape, and may be a lattice shape or the other shapes.

What is claimed is:

1. A semiconductor device comprising:
   a mounting substrate;
   a semiconductor chip mounted on the mounting substrate, the semiconductor chip including a rear surface facing the mounting substrate, a front surface opposite to the rear surface, and at least one heat generating element formed on the front surface;
   a rear-surface metal layer formed on the rear surface of the semiconductor chip, the rear-surface metal layer including gold (Au);
   an AuSn solder layer located between the mounting substrate and the rear surface of the semiconductor chip to fix the semiconductor chip to the mounting substrate through the rear-surface metal layer; and
   a solder blocking metal layer located between the rear surface of the semiconductor chip and the mounting substrate, and in a non-heating region that excludes a heating region in which the at least one heat generating element is formed, the solder blocking metal layer including at least one of nickel-chrome (NiCr), nickel (Ni) and titanium (Ti) and extending to a first edge of the semiconductor chip, wherein a void is provided between the solder blocking metal layer and the AuSn solder layer.

2. The semiconductor device according to claim 1, wherein the solder blocking metal layer is formed on the rear-surface metal layer and between the mounting substrate and the rear-surface metal layer.

3. The semiconductor device according to claim 1, wherein the rear-surface metal layer is formed on a seed metal layer formed on the rear surface of the semiconductor chip.

4. The semiconductor device according to claim 3, wherein the seed metal layer is formed as the solder blocking metal layer, the seed metal layer including at least one of nickel-chrome (NiCr), nickel (Ni) and titanium (Ti) and the solder blocking metal layer is exposed at a portion in which the rear-surface metal layer is removed.

5. The semiconductor device according to claim 1, wherein the solder blocking metal layer linearly extends from a second edge, opposite to the first edge, of the semiconductor chip to the first edge.

6. The semiconductor device according to claim 1, wherein the mounting substrate is a bottom material of a package accommodating the semiconductor chip.

7. The semiconductor device according to claim 1, wherein the at least one heat generating element is afield effect transistor (FET).

8. A semiconductor device comprising:
   a mounting substrate;
   a semiconductor chip mounted on the mounting substrate, the semiconductor chip including a rear surface facing the mounting substrate, and a front surface opposite to the rear surface;
   a rear-surface metal layer formed on the rear surface of the semiconductor chip;
   a solder layer located between the mounting substrate and the rear surface of the semiconductor chip to fix the semiconductor chip to the mounting substrate through the rear-surface metal layer; and
   a solder blocking metal layer located between the rear surface of the semiconductor chip and the mounting substrate, and in a non-heating region that excludes a heating region, the solder blocking metal layer extending to a first edge of the semiconductor chip.

9. The semiconductor device according to claim 8, wherein the semiconductor chip includes a field effect transistor (FET), and the heating region is heated by the FET.

10. A semiconductor device comprising:
    a mounting substrate;
    a semiconductor chip mounted on the mounting substrate, the semiconductor chip including a rear surface facing the mounting substrate, and a front surface opposite to the rear surface;
    a rear-surface metal layer formed on the rear surface of the semiconductor chip;
    a solder layer located between the mounting substrate and the rear surface of the semiconductor chip to fix the semiconductor chip to the mounting substrate through the rear-surface metal layer; and
    a solder blocking metal layer located between the rear surface of the semiconductor chip and the mounting substrate, and in a non-heating region that excludes a heating region.

11. The semiconductor device according to claim 10, wherein
    the semiconductor chip includes a field effect transistor (FET), and
    the heating region is heated by the FET.

* * * * *